(12) United States Patent
Zumkehr

(10) Patent No.: US 6,918,048 B2
(45) Date of Patent: *Jul. 12, 2005

(54) SYSTEM AND METHOD FOR DELAYING A STROBE SIGNAL BASED ON A SLAVE DELAY BASE AND A MASTER DELAY ADJUSTMENT

(75) Inventor: John F. Zumkehr, Orange, CA (US)

(73) Assignee: Intel Corporation, Santa Clara, CA (US)

( * ) Notice: Subject to any disclaimer, the term of this patent is extended or adjusted under 35 U.S.C. 154(b) by 601 days.

This patent is subject to a terminal disclaimer.

(21) Appl. No.: 09/946,346

(22) Filed: Sep. 6, 2001

(65) Prior Publication Data

US 2003/0005346 A1 Jan. 2, 2003

Related U.S. Application Data

(63) Continuation-in-part of application No. 09/892,666, filed on Jun. 28, 2001, now Pat. No. 6,581,017.

(51) Int. Cl.[7] ................................................. G06F 1/12
(52) U.S. Cl. ........................ 713/401; 327/262; 327/277; 365/233
(58) Field of Search .................................. 327/277, 262; 713/401; 365/233

(56) References Cited

U.S. PATENT DOCUMENTS

| | | | | |
|---|---|---|---|---|
| 4,845,390 A | * | 7/1989 | Chan | 327/278 |
| 5,560,000 A | | 9/1996 | Vogley | |
| 5,789,969 A | * | 8/1998 | Davis et al. | 327/276 |
| 5,857,095 A | | 1/1999 | Jeddeloh et al. | |
| 6,242,959 B1 | * | 6/2001 | Stern | 327/262 |
| 6,453,402 B1 | * | 9/2002 | Jeddeloh | 711/167 |
| 6,496,048 B1 | * | 12/2002 | Sikkink | 327/277 |
| 6,581,017 B2 | * | 6/2003 | Zumkehr | 702/107 |

FOREIGN PATENT DOCUMENTS

EP   0 855 653 A1   7/1998

* cited by examiner

Primary Examiner—Thomas Lee
Assistant Examiner—Albert Wang
(74) Attorney, Agent, or Firm—Jeffrey B. Huter

(57) ABSTRACT

A system, method and medium may delay a strobe signal based upon a delay base and a delay adjustment to reduce effects of process variations and/or environmental changes.

30 Claims, 6 Drawing Sheets

SYSTEM AND METHOD FOR DELAYING A STROBE SIGNAL BASED ON A SLAVE DELAY BASE AND A MASTER DELAY ADJUSTMENT

CROSS-REFERENCE TO RELATED APPLICATIONS

This application is a continuation-in-part of and claims the benefit of U.S. application Ser. No. 09/892,666, filed Jun. 28, 2001, now U.S. Pat. No. 6,581,017 entitled "SYSTEM AND METHOD FOR MINIMIZING DELAY VARIATIONS IN DOUBLE DATA RATE STROBES", the contents of which are expressly incorporated by reference herein.

FIELD

The invention relates to memory and more particularly to delaying a strobe signal of a memory system.

BACKGROUND

In the rapid development of computers many advancements have been seen in the areas of processor speed, throughput, communications, and fault tolerance. Microprocessor speed may be measured in cycles per second or hertz. Today's high-end 32-bit microprocessors operate at over 1.8 Ghz (gigahertz), 1.8 billion cycles per second, and in the near future this is expected to go substantially higher to 2.6 and 3.3 Ghz and beyond. At this sort of cycle speed a clock may have to generate a pulse or cycle at least ten times each billionth of a second and usually significantly faster.

With processors operating at such higher rates it is necessary to supply data to the processor when required from memory at a comparable rate otherwise a bottle neck is formed and the processor spends much of its time waiting for data. To improve the transfer rate of memory, Double Data Rate (DDR) memory transfer data at both the leading edge of a clock cycle and the trailing edge of the clock cycle. These memory have a source-synchronous clocking protocol to transfer data from the memory to the memory controller. Data (DQ) from memory is captured by the memory controller using a clock or strobe signal (DQS) supplied by the memory, However, in order to avoid data errors which may occur when the strobe signal levels change, each strobe signal from memory may be delayed, so that data may be strobed in the center of the valid data window. The precision of the delay is important because any variation in the delay translates into added setup/hold time for the memory controller. If the setup/hold time is too large, the system becomes unworkable. This is especially true as memory moves to faster speeds.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

DETAILED DESCRIPTION

Figure 1:
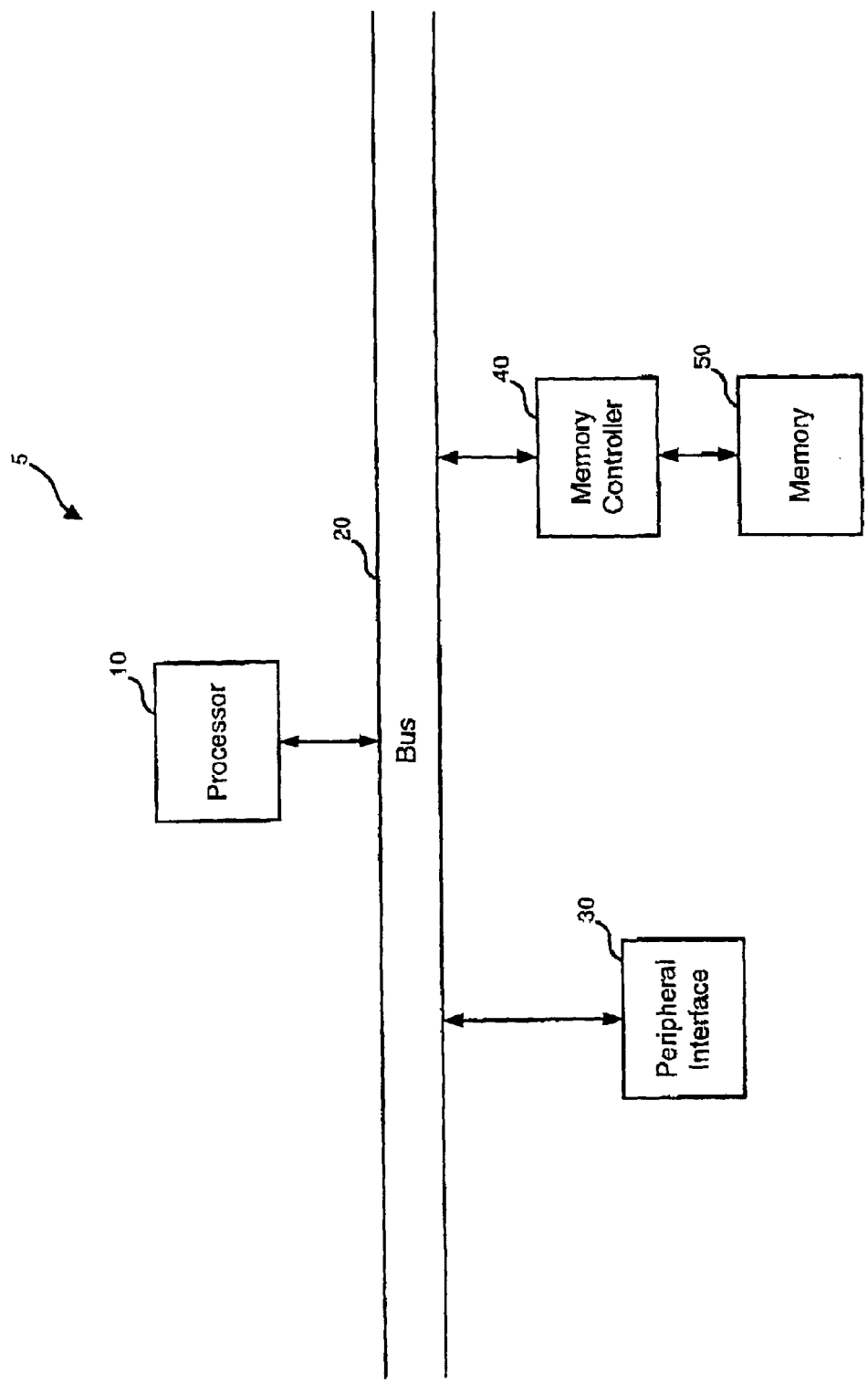
FIG. 1 is a block diagram of an example system.

In the following detailed description, numerous specific details are described in order to provide a thorough understanding of the invention. However, the present invention may be practiced without these specific details. In other instances, well-known methods, procedures, components and circuits have not been described in detail so as not to obscure the present invention. Further, example sizes/ models/values/ranges may be given, although the present invention is not limited to these specific examples.

With regard to the description of any signals, the terms HIGH and LOW and the terms ASSERTED and DEASSERTED may be used in a generic sense to represent logical "1" and logical "0" respectively. More particularly, such terms may be used to avoid confusion when working with a mixture of "active-low" and "active-high" signals, and to represent the fact that the invention is not limited to the illustrated/described signals, but may be implemented with a total/partial reversal of any of the "active-low" and "active-high" signals by a change in logic. Additionally, well known power/ground connections to integrated circuits (ICs) and other components may not be shown within the figures for simplicity of illustration and discussion, and so as not to obscure the invention. Where specific details (e.g., circuits, flowcharts) are set forth in order to describe example embodiments of the invention, it should be apparent to one skilled in the art that the invention may be practiced without, or with variation of, these specific details. Finally, it should be apparent that different combinations of hard-wired circuitry may be used to implement embodiments of the present invention. That is, the present invention is not limited to any specific combination of hardware, software, and/or firmware.

References in the specification to "one embodiment", "an embodiment", "an example embodiment", etc., indicate that the embodiment described may include a particular feature, structure, or characteristic, but every embodiment may not necessarily include the particular feature, structure, or characteristic Moreover, such phrases are not necessarily referring to the same embodiment. Further, when a particular feature, structure, or characteristic is described in connection with an embodiment, it is submitted that it is, within the knowledge of one skilled in the art to effect such feature, structure, or characteristic in connection with other embodiments whether or not explicitly described.

Some portions of the detailed description which follow are presented in terms of algorithms and symbolic representations of operations on data bits or binary digital signals within a memory. These algorithmic descriptions and representations may be the techniques used by those skilled in the data processing arts to convey the substance of their work to others skilled in the art.

An algorithm is herein, and generally, considered to be a self-consistent sequence of acts or operations leading to a desired result. These include physical manipulations of physical quantities. Usually, though not necessarily, these quantities take the form of electrical, magnetic, and/or optical signals capable of being stored, transferred, combined, compared, and/or otherwise manipulated. It has proven convenient at times, principally for reasons of common usage, to refer to these signals as bits, values, elements, symbols, characters, terms, numbers or the like. It should be understood, however, that these and similar terms are to be associated with the appropriate physical quantities and are merely convenient labels applied to these quantities.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. However, "coupled" may also mean that two or more elements are not in direct contact with each other, but yet still co-operate or interact with each other.

Referring now to FIG. 1, there is depicted an example system 5. As may be appreciated by one of ordinary skill in the art numerous configurations of the system 5 are possible. The system 5 may comprise a processor 10 coupled to a bus 20 that may comprise one or more buses and/or bridges. The system 5 may further comprise a peripheral interface 30 and a memory controller 40 coupled to the bus 20. The peripheral interface 30 and the memory controller 40 may receive and transmit data to and from processor 10 via the bus 20. The system 5 may also comprise a memory 50 coupled to the memory controller 40. The memory controller 40 may enable the processor 10 and/or the peripheral interface 30 to access the memory 50.

Figure 2:
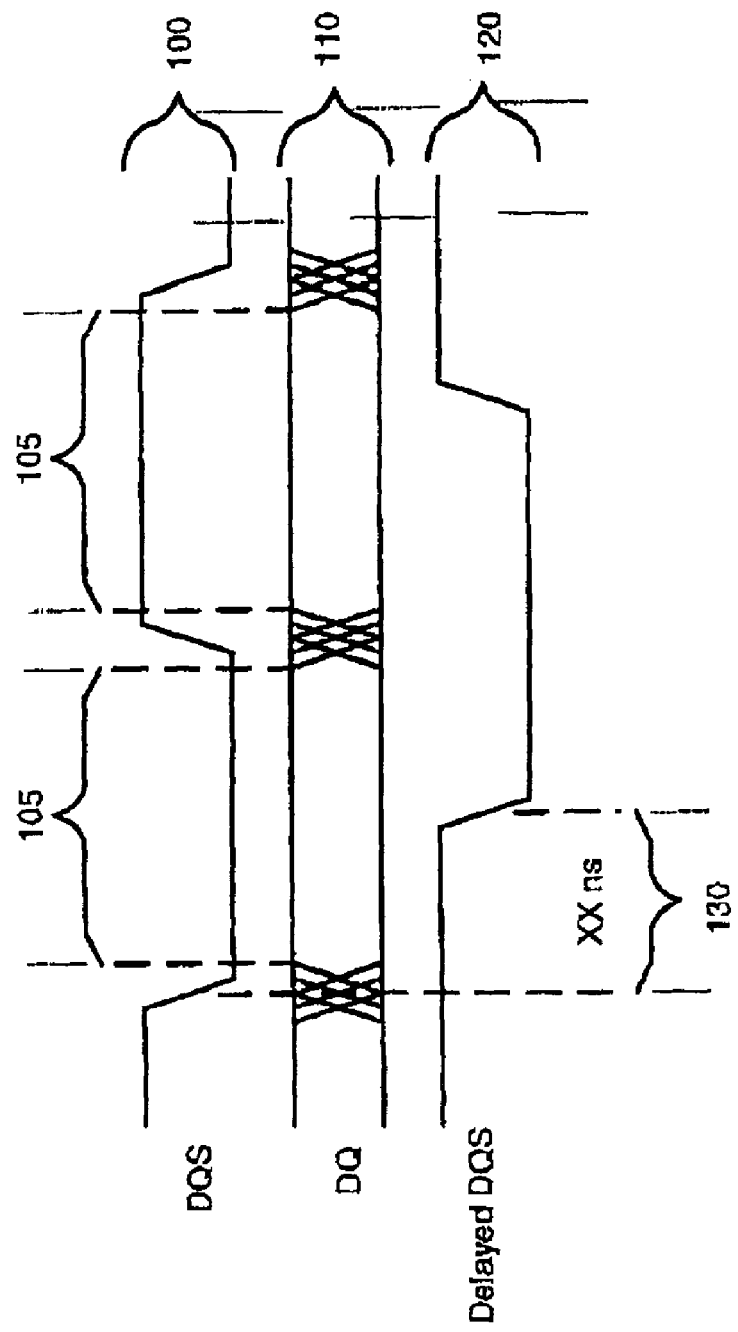
FIG. 2 is a diagram of example memory signals of the system of FIG. 1.

FIG. 2 is a diagram of example memory signals of the memory controller 40. Data (DQ) 110 from the memory 50 is captured by the memory controller 40 using a strobe signal (DQS) 100 supplied by the memory 50. However, in order to avoid errors in the data 110 that may occur in response to changes to the strobe signal 100, each strobe signal 100 from memory 50 may be delayed, so that data 110 may be latched in a valid data window 105 in response to a delayed strobe signal 120 comprising a strobe delay 130.

Figure 3:
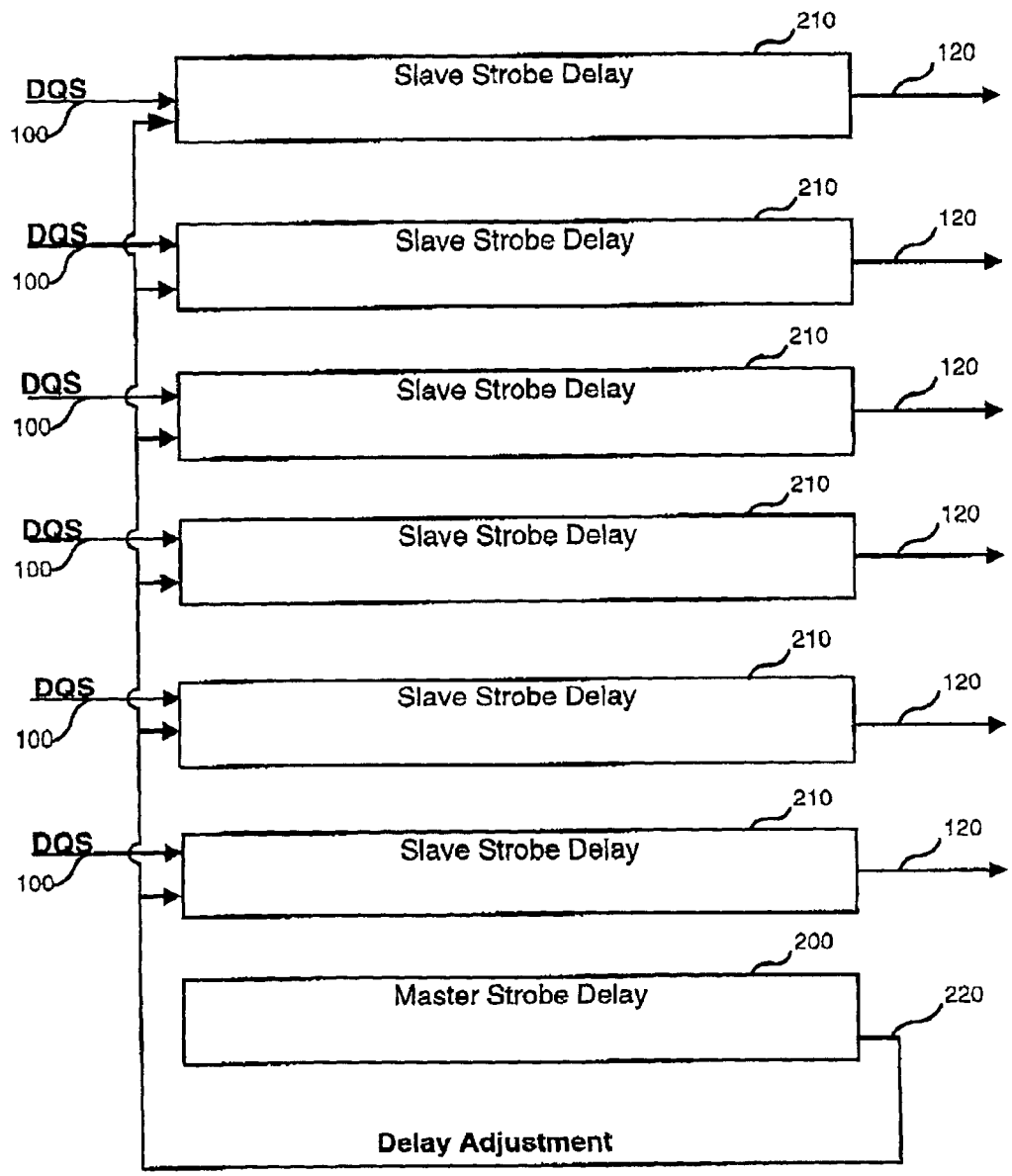
FIG. 3 is a hardware block diagram illustrating a master strobe delay device and slave strobe delay devices of an example memory controller of FIG. 1.

Referring to FIG. 3, a hardware block diagram is shown illustrating a master strobe delay device 200 coupled to six slave strobe delay devices 210 of the memory controller 40. It should be noted that while FIG. 3 depicts one master strobe delay device 200 providing a delay adjustment signal 220 to six slave strobe delay devices 210, the number of master strobe delay devices 200 and the number of slave strobe delay devices 210 may vary based upon design criteria.

The memory controller 40 may utilize a hybrid approach to calibrate the strobe delay 130 of the delayed strobe signal 120. Each slave strobe delay device 210 may individually calibrate their respective delay elements 305 (See, FIG. 4) with a delay base at system startup, or at other times, to compensate for on-die process variations of the respective slave strobe delay device 210. The on-die process variations may be due to variations in the circuit manufacturing process. The master strobe delay device 200 may later provide the slave strobe delay elements 210 with a delay adjustment to compensate for changes in the strobe delay 130 signal caused by changes in temperature and voltage.

Figure 4:
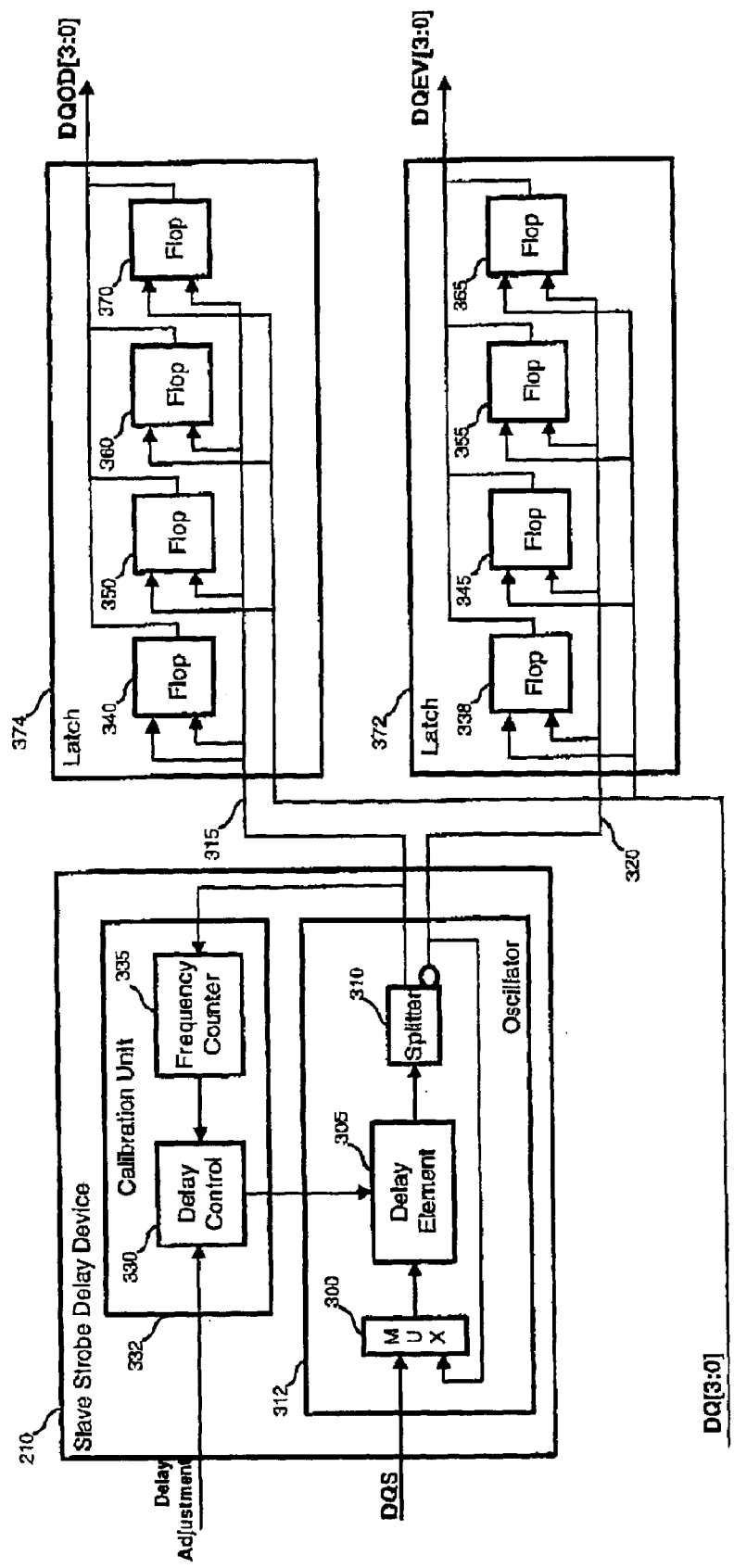
FIG. 4 is a hardware diagram of an example slave strobe delay device of FIG. 3.
Figure 5:
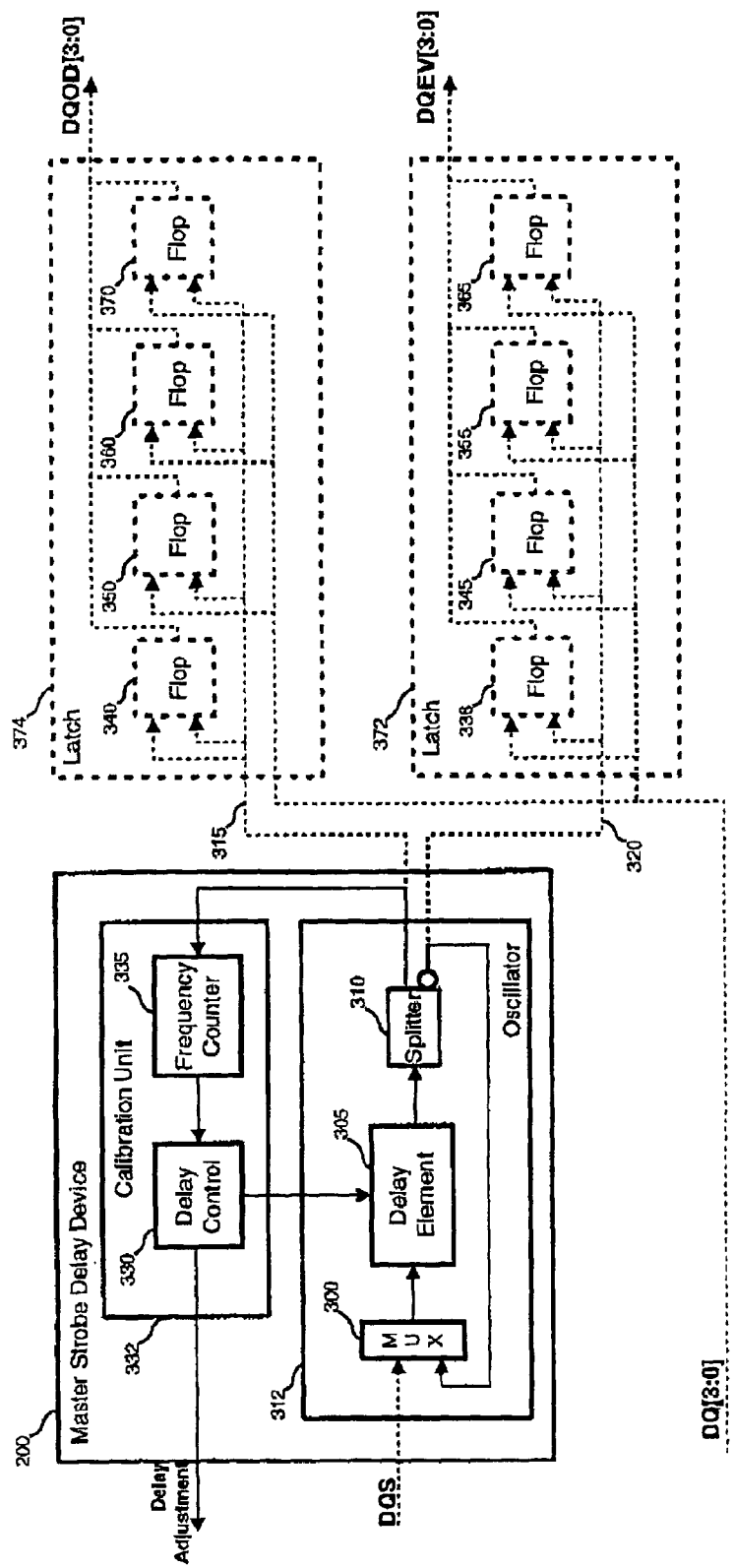
FIG. 5 is a hardware diagram of an example master strobe delay device of FIG. 3.

Referring to FIG. 4 and FIG. 5, the slave strobe delay devices 210 and the master strobe delay device 200 of the memory controller 40 are similarly designed and similarly constructed. Accordingly, the slave strobe delay devices 210 and the master strobe delay device 200 may experience similar changes in operating temperature and voltage and may experience similar operating variations due to the changes in operating temperature and voltage.

Referring to FIG. 4 in more detail, the slave strobe delay device 210 may comprise an oscillator 312 and a calibration unit 332 that provide a delayed strobe signal 120 to associated latches 372, 374. The latch 372 may comprise flops 335, 345, 355, 365 and latch 374 may comprise flops 340, 350, 360, 370. The oscillator 312 may comprise a multiplexer 300, a delay element 305 and a splitter 310.

The multiplexer 300 of the oscillator 312 may receive the strobe signal 100 from the memory 50 and may selectively provide the delay element 305 with either the strobe signal 100 from the memory 50 or a signal 320 from the oscillator 312. The delay element 305 may delay the strobe signal 100 or the signal 320 received from the multiplexer 300 based upon a delay comprising a delay base for the particular slave strobe delay device 210 and a delay adjustment from the master strobe delay device 200. The delay element 305 may provide the splitter 310 with the delayed strobe signal 100 or the delayed signal 320.

The splitter 310 may provide the calibration unit 332 and the latch 374 with a signal 315 that is representative of the signal received from the delay element 305. The splitter 310 may also provide the multiplexer 300 and the latch 372 with the signal 320 that is an inverted representation of the signal 315. In response to the multiplexer 300 selecting the strobe signal 100, the signal 315 represents the strobe signal 100 delayed based upon the delay of the delay element 305 and the other components of the oscillator 312 and corresponds to the delayed strobe signal 120 of FIG. 2. Similarly, in response to the multiplexer 300 selecting the strobe signal 100, the signal 320 comprises an inverted representation of the strobe signal 100 delayed based upon the delay value of the delay element 305 and the other components of the oscillator 312 and corresponds to an inverted representation of the delayed strobe signal 120 of FIG. 2. However, in response to the multiplexer 300 selecting the inverted signal 320 of the splitter 310, the signal 320 may alternate between a HIGH and a LOW state at a frequency that is dependent at least in part upon the delay of the delay element 305.

Still referring to FIG. 4, the calibration unit 332 comprises a frequency counter 335 and a delay control 330. The frequency counter 335 may determine the frequency of the signal 315 generated by the oscillator 312 in response to the multiplexer selecting the signal 320. By determining the frequency of the signal 315, the delay of the delay element 305 may be determined. The frequency counter 335 may provide the delay control 330 with the delay of the oscillator 312. The delay control 330 may update the delay of the delay element 305 based upon a delay adjustment from the master strobe delay device 200. In an embodiment, the delay control 330 adds the delay adjustment 220 to the delay of the delay element 305 to obtain an updated delay and provides the updated delay to the delay element 305 so that the appropriate strobe delay 130 may be maintained.

In an embodiment, the delay controls 330 of the slave strobe delay devices 210 may update the delay of their respective delay elements 305 in response to determining that the delay adjustment 220 is sufficiently large to warrant an update. For example, the delay controls 330 of the slave strobe delay devices 210 may update the delay of their respective delay elements 305 in response to determining that the delay adjustment 220 has a predetermine relationship to a threshold value (e.g. the absolute value of the delay adjustment 220 exceeds and/or is equal to the threshold value).

Still referring to FIG. 4, the data 110 of an embodiment comprises four bits. The flops 340, 350, 360, 370 of the latch 374 may latch the data 110 in response to a rising edge of the signal 315, and the flops 338, 345, 355, 365 of the latch 372 may latch the data 110 in response to a rising edge of the signal 320. Since the signal 315 comprises a representation of the delayed strobe signal 120 and the signal 320 comprises an inverted representation of the delayed strobe signal 120, the data 110 may be latched in response to both the rising and falling edges of the strobe signal 100.

FIG. 5 is a hardware diagram of a master strobe delay device 200 and associated latches 372, 374 of the memory controller 50. As depicted, the master strobe delay device 200 comprises a oscillator 312 and a calibration unit 332. As previously discussed, the master strobe delay device 200 and the slave strobe delay devices 210 may be similarly designed and constructed. However, the memory 50 and the master strobe delay device 200 may be implemented such that the master strobe delay device 200 does not receive the data 110 and the strobe signal 100 from the memory 50. Further, the master strobe delay device 200 may be implemented without associated latches 372, 374.

The calibration unit 332 of the master strobe delay device 200 may determine based upon the frequency of the signal 315 a delay base for its respective delay element 305 in a manner similar to the calibration units 332 of the slave strobe delay devices 210 determining delay bases for their respective delay elements 305. In an embodiment, the calibration units 332 of the master strobe delay device 200 and the slave strobe delay devices 210 contemporaneously determine delay bases for their respective delay elements 305 at system startup or some other specified time.

Figure 6:
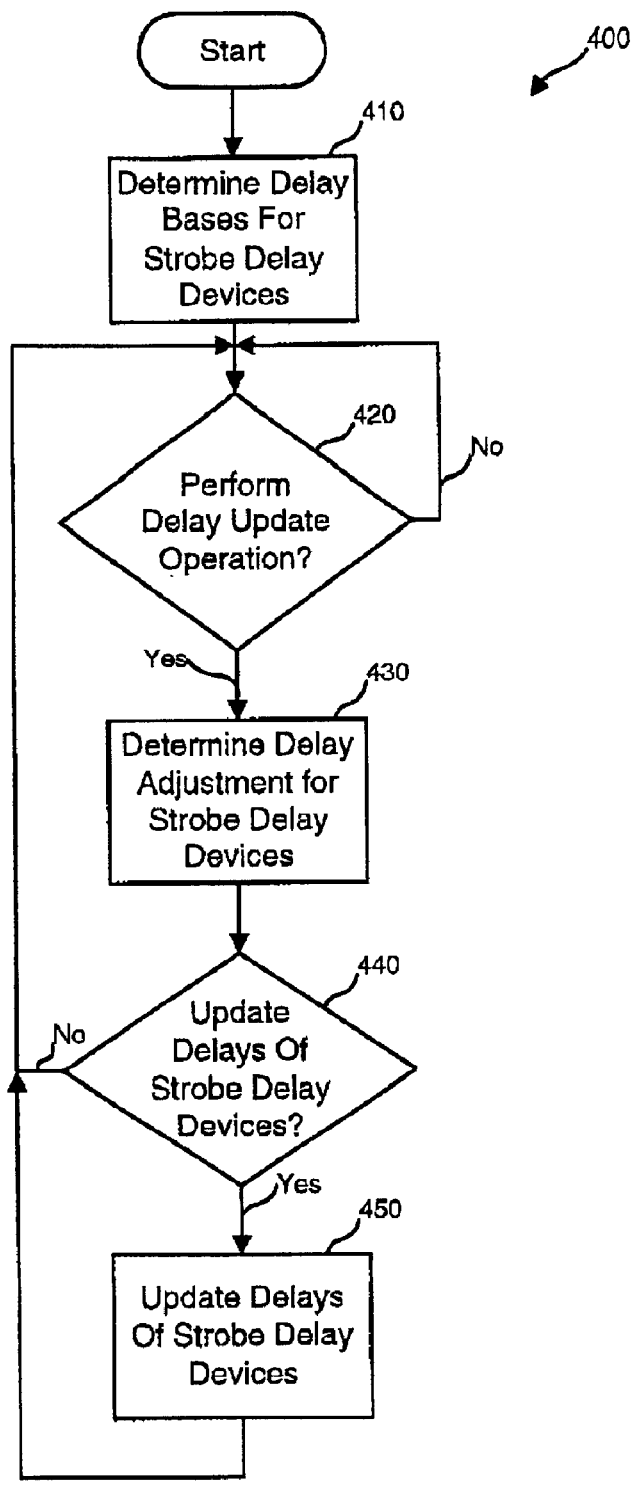
FIG. 6 is a flowchart of an example strobe delay method of the system of FIG. 1.

Besides determining a delay base for the delay element 305, the frequency counter 335 and the delay control 330 may also periodically determine a delay adjustment based upon the frequency of the signal 315. The delay control 330 may provide the delay element 305 with an updated delay based upon the delay adjustment and provide a delay adjustment signal 220 indicative of the delay adjustment to the delay controls 330 of the slave strobe delay devices 210 to cause the delay controls 330 to update the delays of their respective delay elements 305 based upon the delay adjustment, Referring now to FIG. 6, there is depicted a method 400 that may be used by the system 5 to delay a strobe signal 100. The system 5 may perform all or a subset of the method 400 in response to accessing data of a machine-accessible medium such as, for example, one or more read only memory (ROM); random access memory (RAM); magnetic disk storage media; optical storage media; flash memory devices; and/or electrical, optical, acoustical or other form of propagated signals such as, for example, carrier waves, infrared signals, digital signals, analog signals. Furthermore, while method 400 illustrates operation of the system 5 as a sequence of operations, the system 5 may perform various operations in parallel or in a different order.

Referring now to block 410, the master strobe delay device 200 and the slave strobe delay devices 210 may individually provide their respective delay elements 305 with separate delay bases. To this end, the oscillators 312 of the strobe delay devices 200, 210 may generate signals 315 comprising frequencies indicative of the delays of their respective delay elements 305 by selecting the inverted signal 320 with the multiplexers 300. The calibration units 332 of the strobe delay devices 200, 210 may further determine the base delays for the delay elements 305 based upon the frequencies of the signals 315 generated by the oscillators 312 and a desired delay for the slave strobe delay devices 210. As a result of individually determining delay bases for the delay elements 305, the strobe delay devices 200, 210 may have different delay bases that take into account process variations among the strobe delay devices 200, 210.

In an embodiment, the strobe delay devices 200, 210 determine appropriate delay bases in response to a startup process of the system 5. However, the strobe delay devices 200, 210 may determine the delay bases in response to alternative and/or additional events such as, for example, detected environmental changes, errors, elapsed timers, etc.

In block 420, the system 5 may determine whether to perform a delay update operation to adjust the delays of the slave strobe delay devices 210. In an embodiment, the system 5 may determine to perform the delay update operation in response to determining that a predetermined time interval has expired. However, the system 5 may determine to perform the delay update operation to adjust the delays of the slave strobe delay devices 210 in response alternative and/or additional events such as, for example, detected environmental changes, errors, etc.

In response to determining to perform the delay update operation, the master strobe delay device 210 in block 430 may determine a delay adjustment for the delay elements 305 of the strobe delay devices 200, 210. The calibration unit 332 of the master strobe delay device 210 may determine the delay adjustment based upon the frequency of the signal 315 generated by its oscillator 312 and a desired delay for the slave strobe delay devices 210. In an embodiment, the master strobe delay device 210 may determine a difference between a desired strobe delay and the current delay of its oscillator 312 as indicated by the signal 315 and may utilize the determined difference as the delay adjustment. However, master strobe delay device 200 may determine the delay adjustment based upon the signal 315 via other techniques.

In block 440, the system 5 may determine whether the delay adjustment determined in block 430 is large enough to justify updating the delays of the delay elements 305. In response to determining to update the delays of the delay elements 305, the strobe delay devices 200, 210 in block 450 may update the delays of their delay elements 305 thus adjusting the delay of the master strobe delay device 200 and the strobe delay 130 of the delayed strobe signals 120 generated by the slave strobe delay devices 210.

In an embodiment, the delay control 330 of the master strobe delay device 200 may determine in block 440 to cause the delay elements 305 of the strobe delay devices 200, 210 to update their delays in response to determining that the delay adjustment has a predetermined relationship with a threshold value (e.g. the absolute value of the delay adjustment is greater than or equal to the threshold value, the delay adjustment exceeds the threshold value, the delay adjustment is less than a lower threshold value, etc.). In response to determining to update the delays of the delay elements 305, the delay control 330 of the master strobe delay device 200 may provide in block 450 the delay element 305 of the master strobe delay device 200 with an updated delay based upon the delay adjustment. Further, the delay control 330 of the master strobe delay device 200 may provide in block 450 the delay elements 305 of the slave strobe delay devices 210 with a delay adjustment signal 220 indicative of the delay adjustment, and the delay controls 330 of the slave strobe delay devices 210 may provide in block 450 their respective delay elements 305 with an updated delay based upon the delay adjustment indicated by the delay adjustment signal 220.

In another embodiment, the delay control 330 of the master strobe delay device 200 may determine in block 440 to update the delay of the delay element 305 of the master strobe delay device 200 based upon the delay adjustment having a predetermined relationship with a threshold value. Further, the delay controls 330 of the slave strobe delay devices 210 may determine in block 440 to update the delay of their respective delay elements 305 based upon the delay adjustment indicated by the delay adjustment signal 220 received from the master strobe delay device 200. In block 450, the delay control 330 of the master strobe delay device 200 may provide its respective delay element 305 with an updated delay based upon the delay adjustment, and the delay controls 330 of the slave strobe delay device 210 may provide their respective delay elements 305 with an updated delay based upon the delay adjustment indicated by the received delay adjustment signal 220.

Since the master strobe delay device 200 and the slave strobe delay devices 210 of an embodiment are similarly designed and constructed, the strobe delay devices 200, 210 may experience similar environmental changes (e.g. temperature, voltage, etc.) during operation and may experience similar changes in their respective strobe delays 130 in response to the environmental changes. Accordingly, the master strobe delay device 200 may maintain proper strobe delays 130 for the slave strobe delay devices 210 by determining a delay adjustment for itself and providing the delay adjustment to the slave strobe delay devices 210 via the delay adjustment signal 220.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A controller for a memory, comprising
    a slave strobe delay device to delay a strobe signal received from the memory based on a delay comprising a delay base and a delay adjustment; and
    a master strobe delay device to determine the delay adjustment and to provide the delay adjustment to the slave strobe delay device,
    wherein the slave strobe delay device comprises a delay element to delay the strobe signal based on the delay, an oscillator to generate a signal having a frequency based on the delay element, and a calibration unit to determine the delay base based upon the frequency of the signal generated by the oscillator.

2. The controller recited in claim 1, wherein the master strobe delay device further comprises
    an oscillator to generate a signal having a frequency indicative of a delay of the master strobe delay device, and
    a calibration unit to determine the delay adjustment based upon the frequency of the signal generated by the oscillator.

3. The controller recited in claim 1, wherein the master strobe delay device generates a signal indicative of a delay for the master strobe delay device and updates the delay adjustment based upon the signal indicative of the delay of the master strobe delay device.

4. The controller recited in claim 1, wherein the slave strobe delay device further comprises a delay control to adjust the delay as indicated by the delay adjustment provided by the master strobe delay device.

5. The controller recited in claim 1, further comprising a latch to store data in response to the delayed strobe signal of the slave strobe delay device.

6. The controller recited in claim 1, further comprising another slave strobe delay device to delay the strobe signal received from the memory based on another delay comprising another delay base for the another slave strobe delay device and the delay adjustment provided by the master strobe delay device.

7. The controller recited in claim 1, wherein the master strobe delay device periodically determines the delay adjustment.

8. The controller recited in claim 1, further comprising
    another slave strobe delay device to delay the strobe signal received from the memory based on another delay comprising another delay base for the another slave strobe delay device and the delay adjustment provided by the master strobe delay device,
    wherein the master strobe delay device provides the delay adjustment to the slave strobe delay device and the another slave strobe delay device in response to determining that the delay adjustment has a predetermined relationship to a threshold value.

9. A method of delaying a strobe signal, comprising:
    determining a delay base to apply to the strobe signal;
    receiving a delay adjustment to apply to the strobe signal; and
    adjusting, in response to determining that the delay adjustment is sufficiently large to warrant an update, a delay of a delayed strobe signal by delaying the strobe signal based upon the delay base and the delay adjustment.

10. The method recited in claim 9, further comprising:
    latching data in response to the delayed strobe signal.

11. The method recited in claim 9, wherein determining the delay base comprises
    generating a signal indicative of the delay base, and
    adjusting the delay base based upon the signal indicative of the delay base.

12. The method recited in claim 9, wherein determining the delay base comprises
    generating a signal having a frequency that depends upon the delay base, and
    adjusting the delay base based upon the frequency of the signal.

13. The method recited in claim 9, wherein determining the delay base occurs in response to system startup.

14. The method recited in claim 9, wherein receiving comprises periodically receiving the delay adjustment.

15. The method of claim 9 further comprising
    determining that the delay adjustment is sufficiently large to warrant an update in response to determining that the delay adjustment has a predetermined relationship with a threshold.

16. A method of delaying a strobe signal, comprising:
    generating a first delayed strobe signal by a first slave strobe delay device delaying the strobe signal based upon a first delay base for the first slave strobe delay device and a delay adjustment received from a master strobe delay device;

generating a second delayed strobe signal by a second slave strobe delay device delaying the strobe signal based upon a second delay base for the second slave strobe delay device and the delay adjustment received from the master strobe delay device, updating a delay of the first delayed strobe signal in response to the first slave strobe delay device determining that the delay adjustment is sufficiently large, and updating a delay of the second delayed strobe signal in response to the second slave strobe delay device determining that the delay adjustment is sufficiently large.

17. The method recited in claim 16, further comprising:

latching first data in response to the first delayed strobe signal; and latching second data in response to the second delayed strobe signal.

18. The method recited in claim 16, further comprising generating with the master strobe delay device a signal indicative of the delay adjustment, and adjusting with the master strobe delay device the delay adjustment based upon the signal indicative of the delay adjustment.

19. The method recited in claim 16, further comprising determining with the first slave strobe delay device the first delay base for the first slave strobe delay device; and determining with the second slave strobe delay device the second delay base for the second slave strobe delay device.

20. The method recited in claim 16, wherein determining the first delay base and determining the second delay base occur in response to system startup.

21. The method recited in claim 16, further comprising periodically providing the first slave strobe delay device and the second slave strobe delay device with the delay adjustment from the master slave strobe delay device.

22. The method recited in claim 16, further comprising providing the first slave strobe delay device and the second slave strobe delay device with the delay adjustment in response to the master slave strobe delay device determining that the delay adjustment has a predetermined relationship to a threshold value.

23. The method of claim 16 further comprising determining that the delay adjustment is sufficiently large to warrant an update of the first delayed strobe signal in response to the first slave strobe delay device determining that the delay adjustment has a predetermined relationship with a threshold, and determining that the delay adjustment is sufficiently large to warrant an update of the second delayed strobe signal in response to the second slave strobe delay device determining that the delay adjustment has a predetermined relationship with a threshold.

24. A machine-accessible medium comprising data that, in response to being accessed by a machine, cause the machine to determine a plurality of delay bases;

determine a delay adjustment;

generate a plurality of delayed strobe signals each comprising a strobe delay based upon a separate delay base of the plurality of delay bases and the delay adjustment; and adjust the strobe delays of the plurality of delayed strobe signals in response to determining that the delay adjustment has a predetermined relationship to a threshold value.

25. The machine-accessible medium recited in claim 24, wherein the data, in response to being accessed by the machine, further cause the machine to adjust the delay adjustment based upon a signal indicative of the delay adjustment.

26. The machine-accessible medium recited in claim 24, wherein the data, in response to being accessed by the machine, further cause the machine to determine the plurality of the delay bases in response to system startup.

27. The machine-accessible medium recited in claim 24, wherein the data, in response to being accessed by the machine, further cause the machine to periodically adjust the strobe delays of the plurality of delayed strobe signals.

28. A system, comprising:

a memory to provide data and a strobe signal;

a processor to access data of the memory; and a memory controller to delay the strobe signal based upon a plurality of delay bases and a delay adjustment to obtain a plurality of delayed strobe signals each having a strobe delay, to latch data of the memory in response to the plurality of delayed strobe signals, to adjust the strobe delays of the plurality of delayed strobe signals in response to determining that the delay adjustment is sufficient to warrant an update, and to provide the processor with data of the memory.

29. The system recited in claim 28, wherein the memory controller determines the plurality of the delay bases in response to system startup, and periodically updates the delay adjustment after system startup.

30. The system of claim 28 wherein the memory controller determines that the delay adjustment is sufficient to warrant an update in response to the delay adjustment having a defined relationship to a threshold value.

* * * * *